METHOD OF MAKING TRANSISTORS

Filed March 7, 1958

INVENTORS
David Bakalar
David Navon
BY: Ezekiel Wolf
his attorney 2,998,334

METHOD OF MAKING TRANSISTORS

David Bakalar, Boston, and David Navon, West Peabody, Mass.; said Bakalar assignor, by mesne assignments, to Transitron Electronic Corporation, Wakefield, Mass., a corporation of Delaware Filed Mar. 7, 1958, Ser. No. 719,783
5 Claims. (Cl. 148—1.5)

Figure 1:
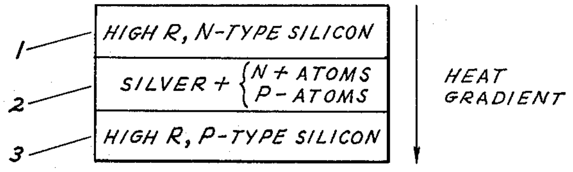
Figure 2:
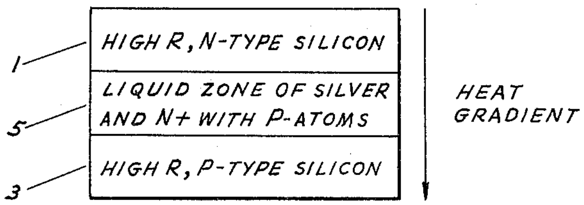
Figure 3:
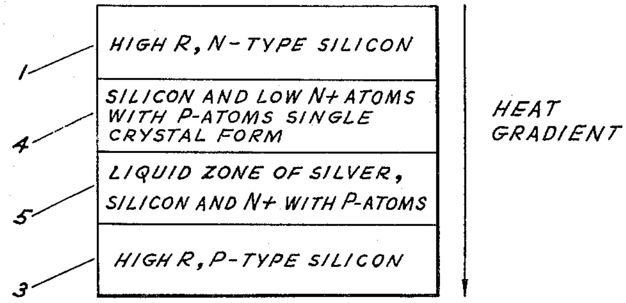

The present invention relates to an improved method of manufacturing junction transistors.

Conventionally transistors have been manufactured by one of four different processes which may be referred to as the grown transistor process, the grown diffused transistor process, the alloyed transistor process and a process in which transistors are made by solid state diffusion of metals of the third and fifth columns of the periodic table introduced by means of a gaseous phase. These various processes which have been used to manufacture transistors have created a number of problems which have resulted in an uncertainty of uniformity in transistors. These processes also contribute to the relatively high expense involved in such manufacture.

Of the above mentioned processes, the last mentioned, the solid diffusion method, is perhaps the most promising used at the present because of the ability in this process to precisely control the spacing between the emitter and collector as well as other dimensions of the transistor. This precise control is due to the relatively slow diffusion rates in the commonly used semiconductors. Precise control of these spacings, particularly between the emitter and collector, is essential for obtaining many characteristics particularly, in transistors designed for high frequency performance.

This last mentioned process, however, has several inherent defects which include the problem of overcoming surface barriers which often result in nonuniformity of the diffusion. Secondly, the semiconductor material tends to deteriorate, particularly in the case of silicon, during the diffusion process due to the high temperatures which are required to effect this diffusion. Thirdly, this particular process does not lend itself readily to a method for securing contacts to the thin emitter and collector layers of the transistor.

Each of these particular problems is overcome in the present invention while at the same time the spacing between the emitter and collector may be precisely controlled. Thus, in the present invention a process for the formation of a junction transistor is provided in which any surface barrier which may have been formed is dissolved and thereby effectively removed as a deterrent factor in the processing of the transistor. This in turn results in transistors of greater yield relative to the amount of material used than previously possible. In addition, the junctions may be formed with relatively large junction areas which adapt this particular process to the formation of power transistors.

In the present invention there is a greatly decreased deterioration of the semiconductor material during the diffusion process. Thus the lifetime characteristics of the resultant transistor may be considerably better than transistors made by the heretofore known solid state diffusion process. In addition, the present invention provides a method in which contacts and leads may be connected readily to the emitter and collector portions of the transistors.

Briefly, in the present invention a method is provided whereby three layers are arranged in sandwich form. The composition of the layers is dependent upon the type of transistor which is to be manufactured. In the case of an N-P-N silicon transistor, the first layer is an N type semiconductor material (preferably of a high resistivity). The second or center layer comprises a material, which is inert insofar as it affects the pertinent characteristics of silicon, including resistivity, which acts as a "sink" to silicon deteriorating materials contained within the silicon mass, which "wets" the silicon well to remove the surface barrier and which moves at a reasonable rate as a liquid zone under a temperature gradient. Such materials include silver or sliver alloy, lead or lead alloy, indium or indium alloy, and tin or tin alloy. The inert layer is doped with both N and P types dope with the N type dope substantially in excess of the P type dope except in the cases of indium or indium alloy which is not inert as it is of the third column of the periodic table and therefore need only be counterdoped with N type atoms. The third layer comprises a high or low resistivity N type or high resistivity P type of semiconductor material. In the case of a P-N-P germanium transistor, the first layer comprises a high resistivity P type of semiconductor. The second layer comprises an inert metal as set forth above, such as silver or silver alloy, lead or lead alloy, or indium or indium alloy. The inert layer is doped with both P and N types of dope with the P type greatly in excess of the N type except indium and indium alloy as indicated above. The third layer in this case may comprise a high or low resistivity P type or high resistivity N type of semiconductor material. In both cases the first layer is designed to be the collector while the third layer is at the emitter side of the transistor ultimately to be formed. The sandwich thus formed by the three layers has a temperature gradient applied across it. This temperature gradient is sufficient to cause the melting of the center or second layer which then migrates in the direction of the third layer, dissolving portions of the third layer in the liquid zone and regrowing the third layer at the other side of the liquid zone. This forms a regrown region adjacent the first layer from which region diffusion takes place. The smaller quantity of dope material diffuses toward the first layer, thus forming three successive layers of semiconductor material of alternate donor and acceptor characteristics adjacent the liquid zone and remainder of the third layer. The remainder of the third layer and solidified zone may be removed after the sandwich is removed from the temperature gradient.

In addition to the foregoing advantages the present invention provides a method which is substantially less expensive than methods heretofore practiced and enables the construction of transistors which have been heretofore commercially impractical.

These and other objects of the present invention will be better understood when considered in conjunction with the drawings in which:

FIGURES 1, 2, 3 and 4 are schematic diagrams of the various stages in processing a typical transistor according to the methods of the present invention.

In the formation of an N-P-N transistor which may be taken as an example of the present invention three layers are formed. The first layer, schematically illustrated at 1 in FIGURE 1, comprises a high resistivity N type silicon semiconductor material having a resistivity of, for example, 10 ohm centimeters and a thickness of, for example, 20 mils. The second or center layer 2, which may be 1 mil thick, comprises, for example, a mixture of silver, arsenic and aluminum in the percentage ratio by weight of silver 99.8%, aluminum .1% and arsenic .1%. The third layer 3 comprises a semiconductor of silicon of the P type having resistivity of 100 ohm centimeters. This third layer may have a thickness of 10 mils.

Figure 4:
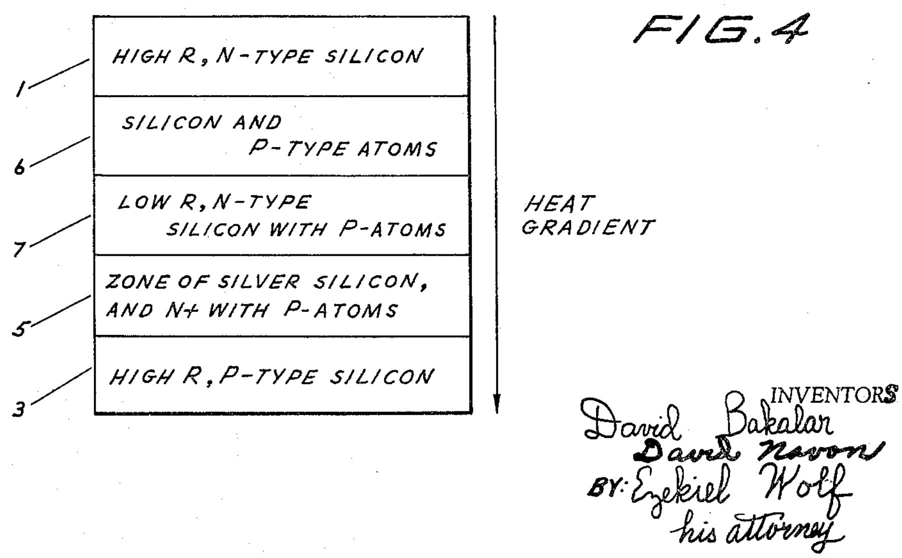

These three layers are clamped together and are inserted in means capable of providing a temperature gradient across the three layers with the hotter side of the gradient at the third layer. This temperature gradient may provide a temperature of 1170° C. on the outer surface of the first layer and 1200° C. on the outer surface of the third layer, thereby providing a gradient of 30° C. across the sandwich which, as noted, is approximately 30 mils thick. The sandwich is subjected to this temperature gradient for a period of four hours. During this application of heat, the center or second layer melts and forms a liquid zone 5 (FIGURE 2) which migrates through the layer 3. On the formation of the liquid zone 5, it comprises a silver alloy composed of silver, the N and P dopes with N in substantial excess of P, and silicon melted from both the first and third layers. As the liquid zone migrates, the silicon on the third layer 3 dissolves into the melt and regrows into a layer 4 (FIGURE 3) of a single crystal form adjacent the first layer 1 of high resistivity N type silicon. The regrown silicon layer 4 is doped with silver and N and P dope. The silver is inert and does not affect the characteristics of the transistor. Because of the initial doping of the silver and the difference in segregation coefficients of the doped material, the regrown region or layer 4 is doped much more heavily with N than with P type of atoms. However, as the P type of atoms diffuse much more rapidly than the N type of atoms in silicon, there is formed a thin diffused layer 6 (FIGURE 4) of P atoms between the greater portion of the regrown region comprising low resistivity N type of silicon with smaller amounts of P atoms from which these P atoms migrate and the layer of high resistivity N type silicon. Upon completion of the migration, many P atoms have diffused from the regrown layer 4 resulting in a composition as illustrated in FIGURE 4 in which layers 1, 6 and 7 are respectively N-P-N layers of semiconductor materials. Layers 5 and 3 may be removed leaving an N-P-N junction capable of being further fabricated into transistors in a conventional manner. This may be accomplished by suitably soldering a collector lead to layer 1, emitter lead to layer 7 and base lead to layer 6 after grinding or cutting the junction to suitable and desired dimensions of thickness, width and length.

In the process of forming N-P-N silicon transistors, there is an effective temperature range of between substantially 1100° C. minimum and 1350° C. maximum within which the sandwich may be heated. At temperatures above 1350° C. the silicon becomes plastic and thereby deforms. At temperatures below 1100° C. the time factor becomes too long for practical usage. The choice of temperature gradients, however, is largely a matter of mechanical limitation. A gradient of 30° C. has been found to be quite possible across a sandwich of 30 mils thickness.

Layer 1 of silicon having N type semiconductor characteristics may have a resistivity range which is quite variable depending upon the desired characteristic with a range of from 1 to 10 ohm centimeters being satisfactory. The second layer of material may comprise a composition of silver or lead with N and P dopes. Typical formulas are set forth below:

| Ingredient: | Percentage |
|---|---|
| Arsenic | .1 |
| Aluminum | .1 |
| Silver | 99.8 |
| Antimony | 1.0 |
| Gallium | .2 |
| Silver | 98.8 |
| Lead | 99.8 |
| Arsenic | .1 |
| Aluminum | .1 |
| Lead | 98.8 |
| Antimony | 1.0 |
| Gallium | .2 |

Each of these compositions comprises a layer of silver or lead having impurities with greater N type segregation properties. However, in each instance the P type impurities have greater diffusion than the N type.

Layer 3 may comprise either high or low resistivity N type of silicon or a high resistivity P type of material with the range of P type of material from for example, 10 ohm centimeters to 100 ohm centimeters and N type material from .01 ohm centimeters to 100 ohm centimeters. The particular composition of the first and third layers is not critical and as indicated depends upon the particular characteristics desired.

The thickness of the various layers is principally a matter of choice with the optimum values being substantially as set forth above. Variations may be made to obtain transistors of other thicknesses.

While the foregoing examples have been described in connection with N-P-N transistors, the present invention also contemplates its use in connection with the formation of P-N-P transistors utilizing germanium semiconductor material. In this process, the first layer, corresponding to layer 1 in FIGURE 1, which forms the collector end of the transistor, is a high resistivity P type of germanium material. The second or center layer is an inert metal of the same type as previously mentioned, as for example silver, mixed together with both P and N types of dopes with, however, the P type dope in excess of the N type dope. This may be obtained by a formulation which includes as for example by percentage of weight:

| | Percent |
|---|---|
| Silver | 98.8 |
| Antimony | .2 |
| Gallium | 1.0 |

Thus the gallium, a P type impurity, has a greater segregation property than antimony, the N type impurity. However, the antimony has a greater diffusion property than gallium.

The third layer is a high or low resistivity P type germanium material or a high resistivity N type germanium material. The temperature gradient is applied in the same manner as previously described in order to form a liquid zone which is similar to the liquid zone 5 of FIGURE 2. However, in this case, the P type dope is in excess of the N type dope. The layer 3, which is of a high or low resistivity P type of material or high resistivity N type of material, is regrown as single crystal layer, similar to layer 4, in this case however with P type of material with a smaller amount of N type material. The N type of material in this case diffuses much more rapidly than the P type of material in germanium and thereby migrates toward layer 1 forming a P–N–P junction capable of being further processed and fabricated into a transistor.

It should be noted that silver has been found to be the most preferred form of inert metal for use in the present invention, for, as indicated, silver acts as a getter or "sink" in the absorption of silicon deteriorating impurities during the deterioration process, does not seriously affect the resistivity of the silicon, "wets" the silicon surface to remove surface barrier, and moves at a reasonable rate as a liquid zone. Lead acts similarly to silver but is not believed as satisfactory as silver as it is slow in migrating. It will be noted that layers of silver and lead are particularly easy to alter with the required amounts of P and N as there is no problem of counterdoping.

Also satisfactory for the intermediate region are metals which include tin and indium. Tin is inert and is treated similar to silver and lead. Indium being of the third column of the periodic table is a P type atom and therefore not inert. Its segregation coefficient is low and therefore it can be counterdoped with N type atoms to permit a satisfactory regrowth and diffusion to take place. Not all metals of the third column are, however, satisfactory.

The present invention also contemplates the use of silicon carbide in the semiconductor layer.

As in conventional "zone melting" processes the atmosphere in which the method is practiced conventionally should be such as not to adversely affect the characteristics of the resultant structure, and may therefore comprise, for example, an inert gas.

I claim:

1. A method of making a junction semiconductor device which method includes the steps of placing a doped metal layer between and in contact with a pair of semiconductor layers of predetermined conductivity type to form a sandwich, said doped metal being silver doped with materials selected from the group consisting of (*a*) P-type and N-type impurities with one type having greater segregation properties than the other and with said other type of impurity capable of diffusing into an adjacent semiconductor body more rapidly than said one type and (*b*) indium impurity doped with an N-type impurity, said impurity for indium having different segregation properties than said indium and with the impurity having lesser segregation properties capable of diffusing into a semiconductive body more rapidly than the impurity having greater segregation properties therein, subjecting top and bottom surfaces of said sandwich to different temperatures to establish a temperature gradient across said sandwich with the internal temperatures thereof being above the melting point of said doped metal but below the melting point of said semiconductor layers, maintaining said temperature gradient across said sandwich while said metal migrates toward one of said semiconductor layers and the P-type and N-type impurity in said metal are first segregated in a layer adjacent the other of said layers with one type of said impurity predominating therein due to the difference in segregation coefficients and thereafter the other type of said impurity diffuses a greater distance into the other of said layers, and cooling said sandwich to allow the regrowth of a rectifying junction between said layers.

2. A method in accordance with claim 1 wherein said semiconductor layers are silicon and said internal temperatures are within the range of 1100° to 1350° centigrade.

3. A method in accordance with claim 2 wherein said doped metal layer consists of substantially 0.1% arsenic, 0.1% aluminum and 98.8% metal in silver.

4. A method in accordance with claim 2 wherein said doped metal layer consists of substantially 1.0% antimony, 0.2% gallium and 98.8% metal in silver.

5. A method in accordance with claim 2 wherein said doped metal layer consists of substantially 1.0% gallium, 0.2% antimony and 98.8% silver.

References Cited in the file of this patent

UNITED STATES PATENTS

| | | |
|---|---|---|
| 2,552,935 | Chadwick et al. | May 15, 1951 |
| 2,708,646 | North | May 17, 1955 |
| 2,813,048 | Pfann | Nov. 12, 1957 |
| 2,793,115 | Bredzs et al. | May 21, 1957 |
| 2,822,307 | Kopelman | Feb. 4, 1958 |
| 2,836,521 | Longini | May 27, 1958 |
| 2,840,497 | Longini | June 24, 1958 |

FOREIGN PATENTS

| | | |
|---|---|---|
| 721,671 | Great Britain | Jan. 12, 1955 |